(12) United States Patent
Colinge et al.

(10) Patent No.: US 9,147,753 B2
(45) Date of Patent: Sep. 29, 2015

(54) FINFET HAVING UNIFORM DOPING PROFILE AND METHOD OF FORMING THE SAME

(71) Applicant: Taiwan Semiconductor Manufacturing Company, Ltd., Hsin-Chu (TW)

(72) Inventors: Jean-Pierre Colinge, Hsin-Chu (TW); Wen-Hsing Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 107 days.

(21) Appl. No.: 13/683,833

(22) Filed: Nov. 21, 2012

(65) Prior Publication Data
US 2014/0138780 A1    May 22, 2014

(51) Int. Cl.
*H01L 21/336* (2006.01)
*H01L 29/66* (2006.01)

(52) U.S. Cl.
CPC .... *H01L 29/66795* (2013.01); *H01L 29/66545* (2013.01)

(58) Field of Classification Search
USPC .......................................... 257/402; 438/197
See application file for complete search history.

(56) References Cited

U.S. PATENT DOCUMENTS 7,326,656 B2 * 2/2008 Brask et al. ............... 438/785
2012/0256238 A1 * 10/2012 Ning et al. ............... 257/280

* cited by examiner

*Primary Examiner* — Marvin Payen
(74) *Attorney, Agent, or Firm* — Slater & Matsil, L.L.P.

(57) ABSTRACT

An embodiment fin field effect transistor (FinFET) device and method of forming the same. An embodiment method of forming a fin field effect transistor (FinFET) includes forming fins from a semiconductor substrate, forming a field oxide between the fins, forming a sacrificial gate over a channel region of the fins projecting from the field oxide, and implanting ions through the sacrificial gate to provide the channel region of the fins with a uniform doping profile.

20 Claims, 11 Drawing Sheets

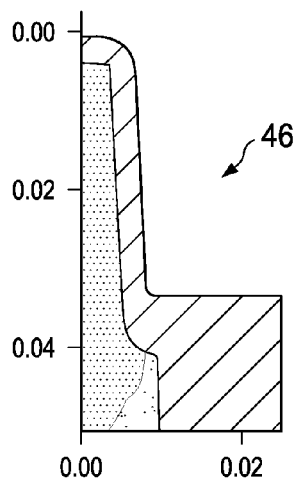
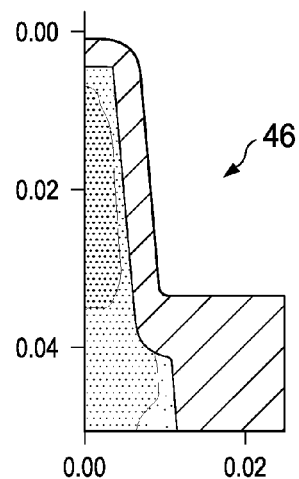
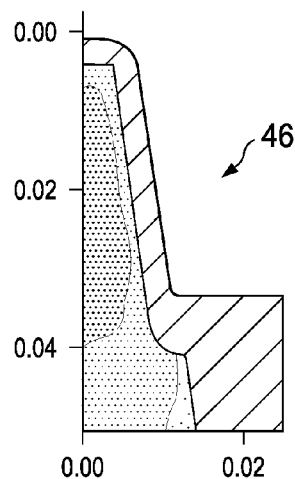
FIG. 6a    FIG. 6b    FIG. 6c
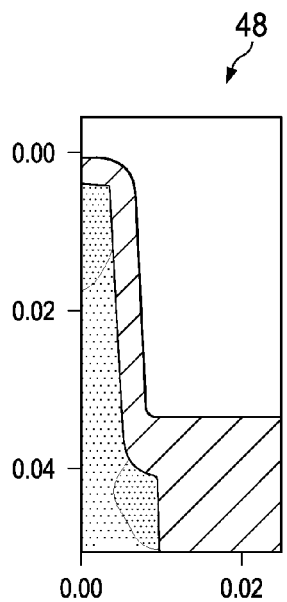
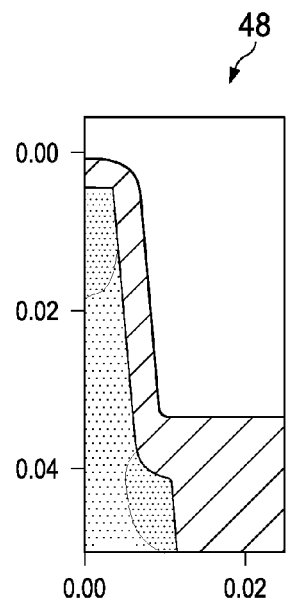
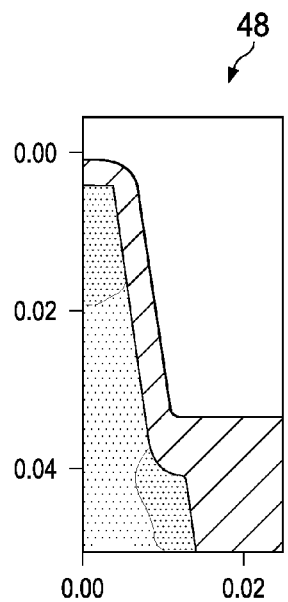
FIG. 7a    FIG. 7b    FIG. 7c

FINFET HAVING UNIFORM DOPING PROFILE AND METHOD OF FORMING THE SAME

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors are used in sub 32 nm transistor nodes. FinFETs not only improve areal density, but also improve gate control of the channel.

Unfortunately, the doping profile in the channel of the FinFETs may vary widely due to the method of fabrication. For example, the doping profile may vary considerably when impurities are implanted directly into the fins using a vertical or tilted implantation angle. The non-uniform doping profile in the channel of the FinFETs may cause undesirable variability in device parameters including, for example, the threshold voltage.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 6a-6c illustrate channel dose contours for the conventional implantation process of FIG. 5a at various taper angles;

FIGS. 7a-7c illustrate channel dose contours for the embodiment implantation process of FIG. 5b at various taper angles;

FIG. 8a is a graphical representation illustrating the threshold voltage for a multi-threshold voltage assessment using the conventional implantation process of FIG. 5a.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to preferred embodiments in a specific context, namely a FinFET metal oxide semiconductor (MOS) transistor. The invention may also be applied, however, to other integrated circuits, electronic structures, and the like.

Figure 1:
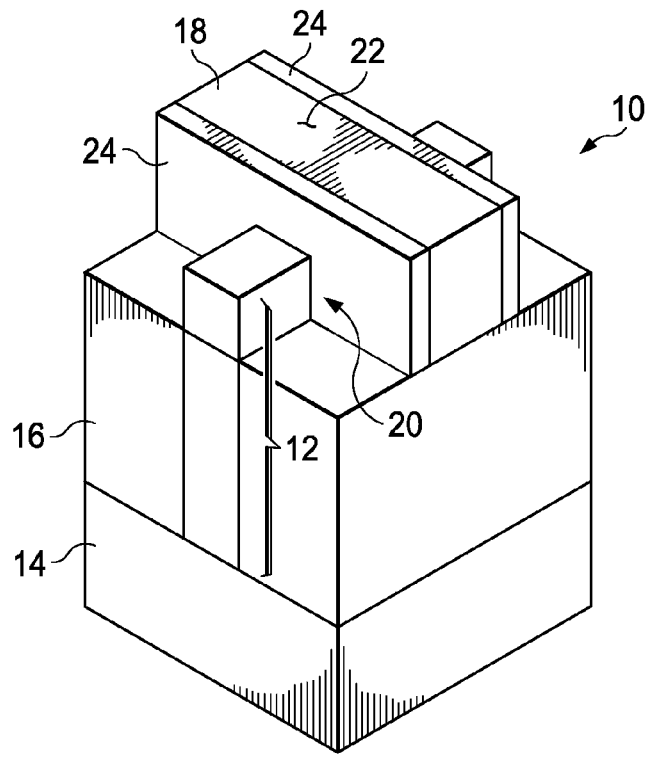
FIG. 1 illustrates an embodiment FinFET in an intermediate stage of fabrication is illustrated.

Referring now to FIG. 1, an embodiment FinFET 10 in an intermediate stage of fabrication is illustrated. As shown, the embodiment FinFET 10 includes a fin 12 formed from or on a semiconductor substrate 14 (e.g., silicon). In an embodiment, the semiconductor substrate 14 is recessed to form the fin 12. In an embodiment, the fin 12 is epitaxially-grown on the semiconductor substrate 14. In an embodiment, the fin 12 and the semiconductor substrate 14 are formed from silicon, germanium, silicon germanium, one of the III-V compound semiconductors, or another semiconductor material.

Still referring to FIG. 1, a field oxide 16 is disposed on opposing sides of the fin 12 and supported by the underlying silicon substrate 14. In an embodiment, the field oxide 16 comprises a shallow trench isolation (STI) region. In an embodiment, the field oxide 16 is an oxide diffusion (OD) region. In an embodiment, an upper portion of the field oxide 16 is recessed such that a portion of the fin 12 projects from, or extends above, the field oxide 16. The portion of the fin 12 that extends above the field oxide 16 is a channel region 20 (i.e., channel) of the fin 12.

In an embodiment, the channel region 20 is germanium (Ge), the remainder of the fin 12 is silicon germanium (SiGe), and the substrate 14 is a silicon wafer. As another example, the channel region 20 and the remainder of the fin 12 are silicon germanium (SiGe) and the substrate 14 is a silicon wafer. As yet another example, the channel region 20 is silicon (Si), the remainder of the fin 12 is silicon germanium (SiGe), and the substrate 14 is a silicon wafer.

Still referring to FIG. 1, a sacrificial gate 18 is formed over the channel region 20 of the fin 12. In an embodiment, the sacrificial gate 18 has a flat upper surface 22. The flat upper surface 22 may be formed using, for example, a chemical-mechanical planarization (CMP) process.

In an embodiment, the sacrificial gate 18 and the channel 20 are chemically matched with each other. For example, when the channel 20 is formed from silicon the sacrificial gate 18 is formed from polysilicon. As another example, when the channel 20 is formed from germanium the sacrificial gate 18 is formed from polycrystalline germanium. Indeed, the sacrificial gate 18 is generally the same material as the underlying channel 20 and semiconductor substrate 14. Even so, the sacrificial gate 18 is generally in a polycrystalline form. In an embodiment, the sacrificial gate 18 is formed from polysilicon regardless of the composition of the channel 20.

Figure 2:
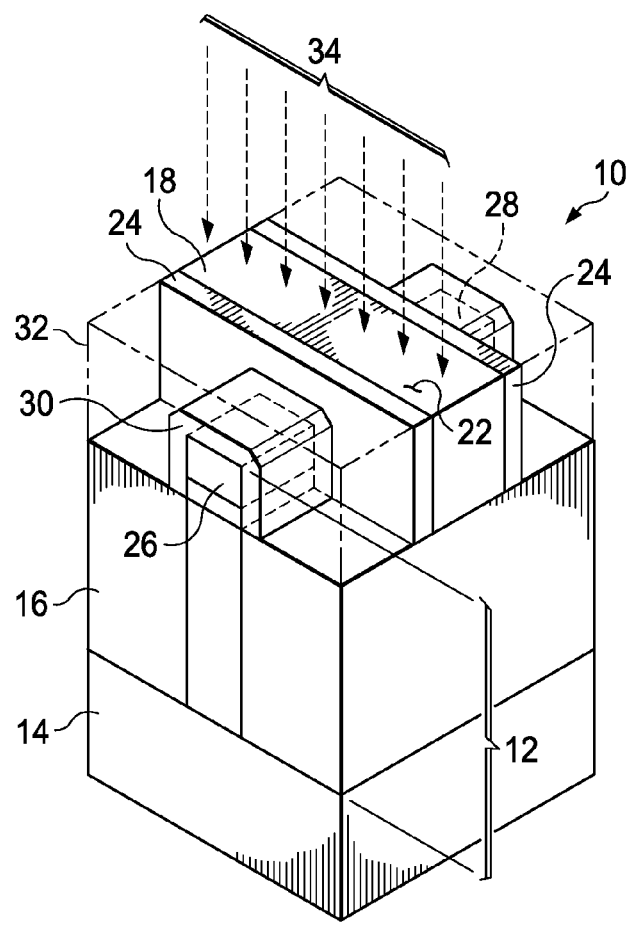
FIG. 2 illustrates the embodiment FinFET device in a later stage of fabrication.

Still referring to FIG. 1, lateral spacers 24 are formed on opposing sides of the sacrificial gate 18. As shown in FIG. 2, the exposed portions of the fin 12 outside the lateral spacers 24 are doped to generate a source 26 on one side of the sacrificial gate 18 and a drain 28 (which is hidden; see FIG. 4d) on an opposite side of the sacrificial gate 18. Once the source 26 and the drain 28 region have been suitably doped, a semiconductor material 30 is epitaxially grown over the source 26 and the drain 28 as shown in FIG. 2. In an embodiment, the semiconductor material 30 is formed from silicon, silicon germanium, silicon carbon phosphorus, and so on. Still referring to FIG. 2, the semiconductor material 30 on each of the source 26 and the drain 28 is covered by an interlevel dielectric (ILD) 32 to complete the FinFET 10 or to advance the FinFET to a later stage of fabrication.

As will be more fully explained below, the sacrificial gate 18 depicted in FIG. 2 provides the channel region 20 (FIG. 1) of the fin 12 with a uniform doping profile after an implantation of ions 34. In other words, the sacrificial gate 18 reduces the variability of the doping profile in the channel region 20 of the fin 12. This is due, at least in part, to the fin 12 being covered by the sacrificial gate 18 and/or the sacrificial gate 18 and the fin 12 being formed from chemically similar materials such as silicon and polysilicon, respectively.

Figure 3:
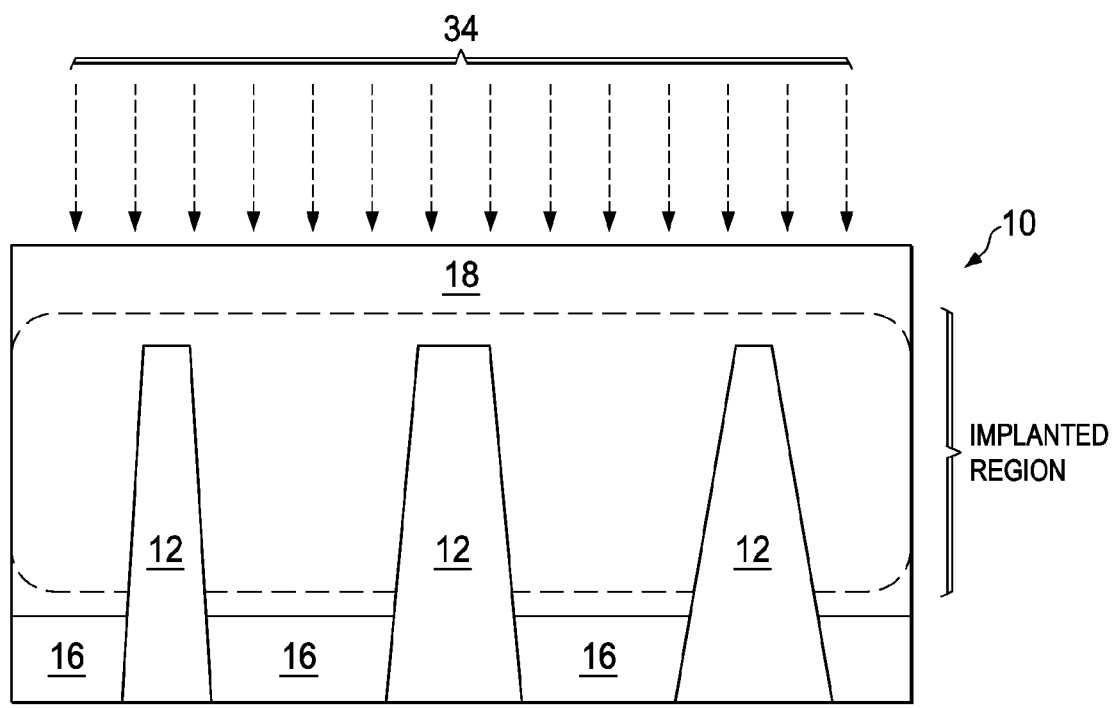
FIG. 3 illustrates the embodiment FinFET device of FIG. 2 having several fins of with varying geometries.

While a single fin 12 is illustrated in the FinFET 10 of FIGS. 1-2, it should be recognized that the FinFET 10 may include several adjacent fins 12 in practical applications as illustrated in FIG. 3. As shown in FIG. 3, the FinFET 10 includes three of the fins 12 being subjected to the implantation of ions 34 through the sacrificial gate 18. While three of the fins 12 are illustrated in FIG. 3, it should be recognized that more or fewer fins 12 may be formed in the FinFET 10.

Still referring to FIG. 3, each of the fins 12 may have a different geometry or peripheral profile. Indeed, some of the fins 12 may be larger than others, some may have a different sidewall slope (i.e., or angle) relative to others, some may have a smaller top surface than others, and so on. Despite these different geometries, each of the fins 12 is provided with the uniform doping profile after the implantation of ions 34. Indeed, the uniform doping profile of the fins 12 is independent of the geometry and/or variations of the fins 12 because the penetration of the implanted ions (e.g., projected range, straggle, etc.) is the same or similar in the sacrificial gate 18 and the channel region 20 of the fins 12.

Figure 4A:
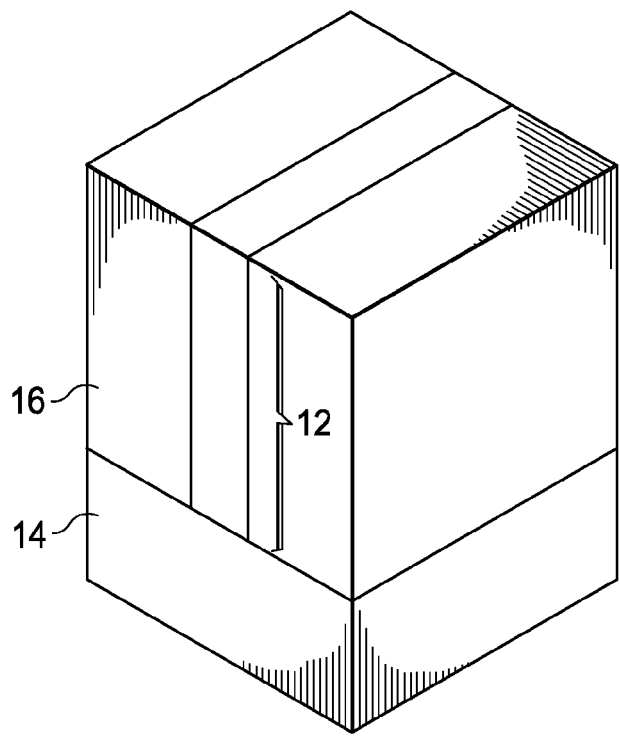
FIGS. 4a-4j collectively illustrate a process of fabricating the embodiment FinFET of FIG. 2.

Referring collectively to FIGS. 4a-4j, a process of fabricating the FinFET 10 of FIG. 2 is schematically illustrated. As shown in FIG. 4a, the fin 12 (or several of the fins, as shown in FIG. 3) is formed on or from the semiconductor substrate 14 and between the field oxide 16. In an embodiment, the fin 12 is formed by etching the semiconductor substrate 14. In addition, in an embodiment a chemical-mechanical planarization (CMP) process is performed to flatten the top surface of the field oxide 16.

Figure 4B:
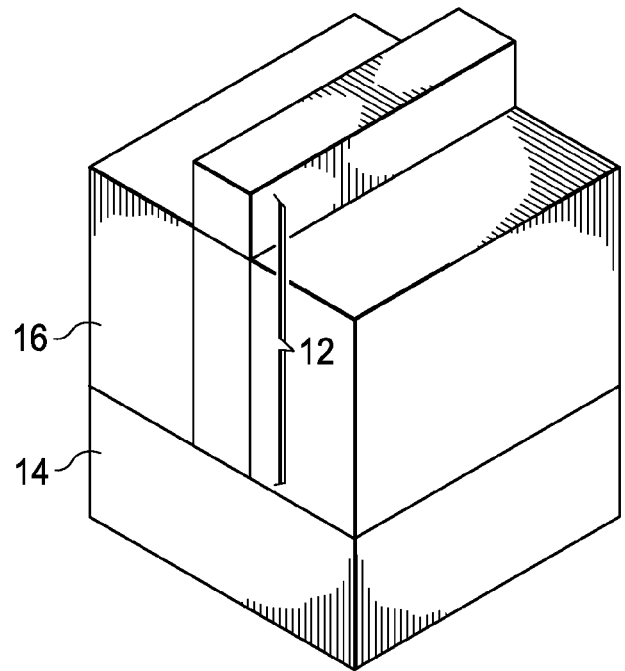
Figure 4C:
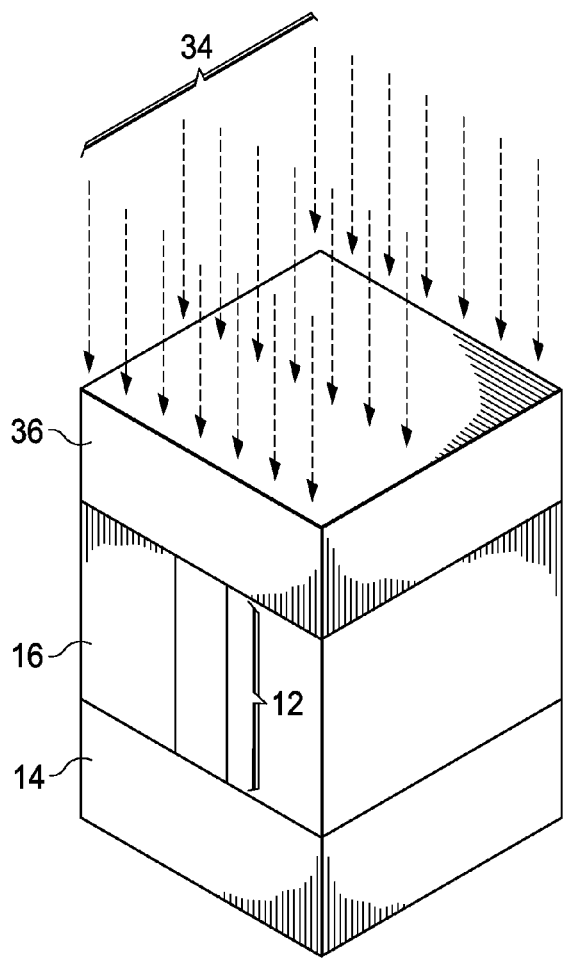

Referring now to FIG. 4b, the field oxide 16 is recessed to expose a portion of the fin 12. Thereafter, as shown in FIG. 4c, a sacrificial gate layer 36 is formed over the fin 12 and the field oxide 16. In an embodiment, the sacrificial gate layer 36 is then subjected to a chemical-mechanical planarization (CMP) process to flatten or smooth the top surface thereof.

In an embodiment, the sacrificial gate layer 36 is formed from polysilicon or some other element in crystalline form. Even so, other materials may also be used. Indeed, using any solid material deposited over the fin 12, which is subsequently subjected to a chemical-mechanical planarization (CMP) process, is preferable to having nothing (e.g., air, a vacuum) over the fin 12. Indeed, the chosen material will improve the uniformity of the implant profile in the fin 12.

In an embodiment, the implantation of ions 34 occurs after the sacrificial gate layer 36 has been formed as shown in FIG. 4c. As noted above, the implantation of ions 34 is performed through the sacrificial gate layer 36 (or some portion thereof, such as the sacrificial gate 18 in FIG. 2) in order to provide the fin 12 and, in particular, the channel region 20 (FIG. 1) of the FinFET 10 with a uniform doping profile. However, as will be more fully explained below, the implantation of ions 34 may also be performed later in the FinFET 10 formation process. In an embodiment, any element from the periodic table may be utilized for the implantation of ions 34. For example, the doping atoms may include, but are not limited to, boron (B), gallium (Ga), indium (In), phosphorus (P), arsenic (As), and antimony (Sb).

The implant species, energy, and/or dose may be chosen using, for example, simulation tools. As such, a particular parameter of the FinFET 10 such as, for example, a threshold voltage ($V_{th}$) may be tuned to a desired value. In addition, the different implant species, energy, and/or dose may be introduced in different devices using masking (i.e., lithography) in order to obtain devices with different threshold voltages or different polarities (i.e., n-channel or p-channel).

Figure 4D:
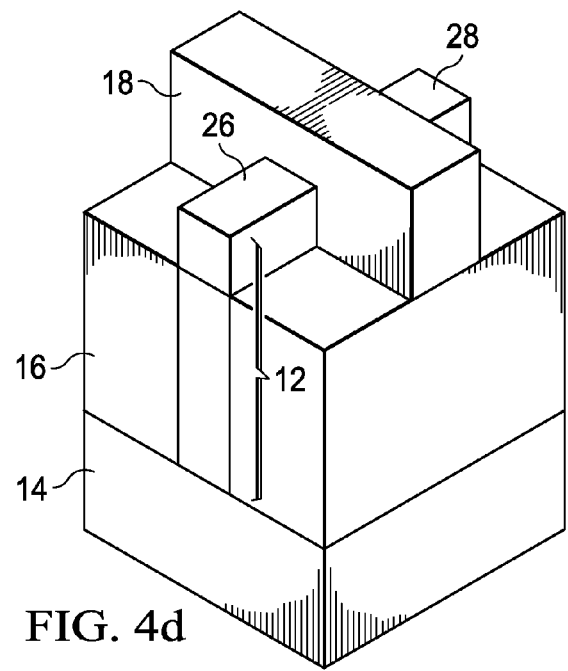
Figure 4E:
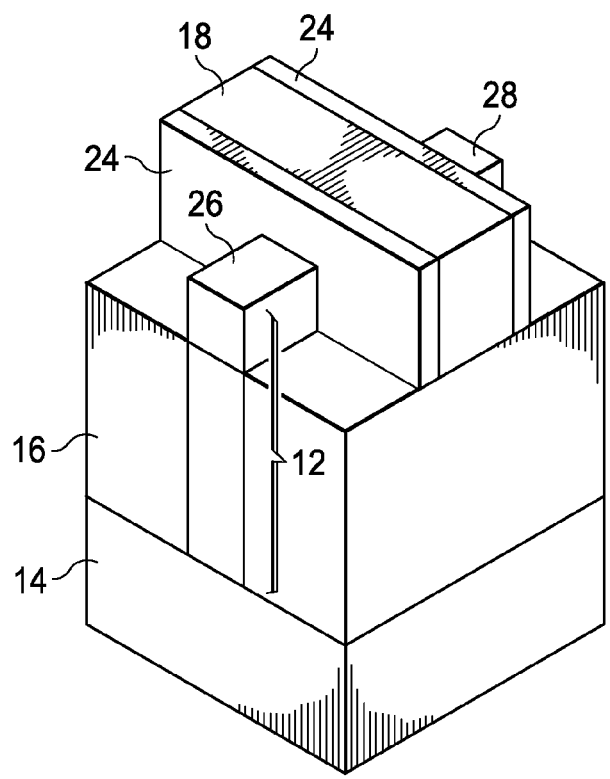

Referring now to FIG. 4d, the sacrificial gate layer 36 (FIG. 4c) is patterned generate the sacrificial gate 18. Thereafter, as shown in FIG. 4e, lateral spacers 24 are formed on opposing sides of the sacrificial gate 18. Then, the portions of the fin 12 that are still exposed on opposing sides of the sacrificial gate 18 are doped to form the source 26 and the drain 28.

Figure 4F:
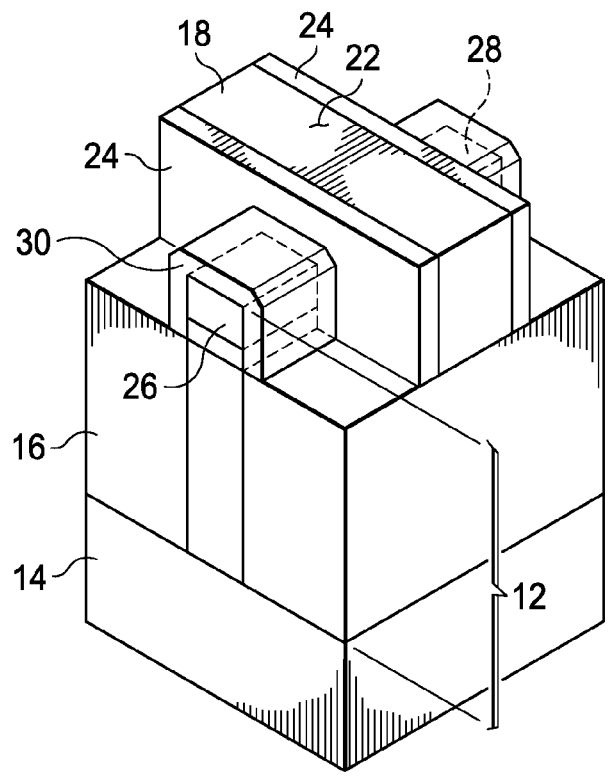
Figure 4G:
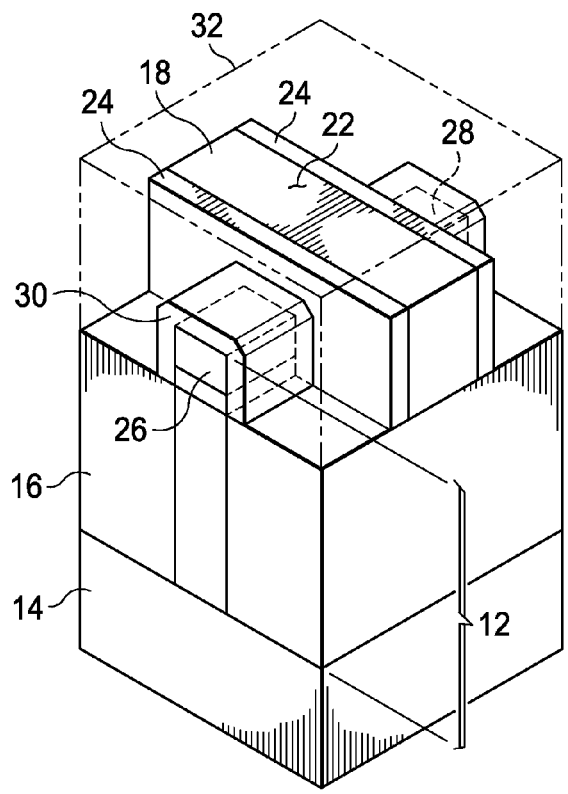

Next, as shown in FIG. 4f, the semiconductor material 30 (e.g., silicon, silicon germanium, silicon carbon phosphorus, etc.) is epitaxially grown over the source 26 and the drain 28. Moving now to FIG. 4g, the interlevel dielectric (ILD) 32 is formed over the epitaxially-grown semiconductor material 30, the spacers 24, and the sacrificial gate 18. In an embodiment, the interlevel dielectric 32 is formed from silicon dioxide or other suitable dielectric material. In an embodiment, the interlevel dielectric 32 is then subjected to a chemical-mechanical planarization (CMP) process.

Figure 4H:
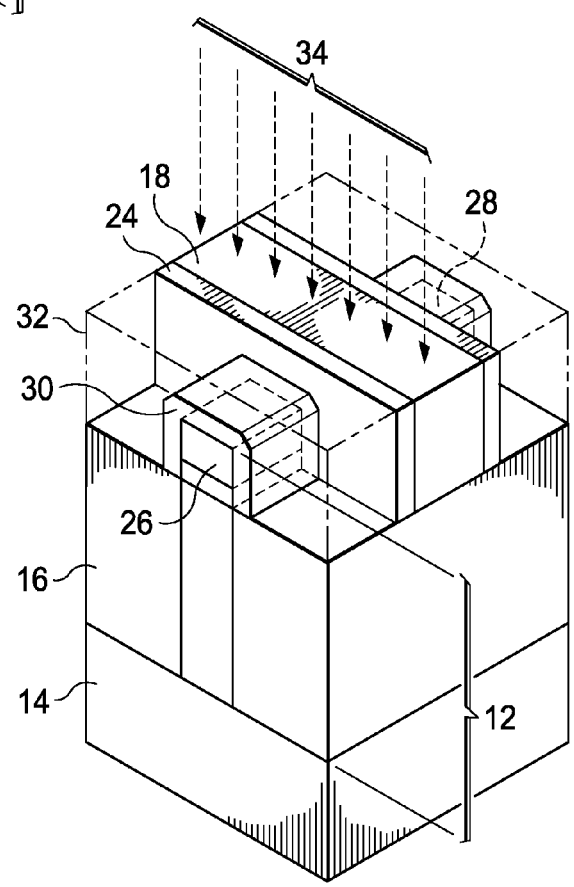
Figure 4I:
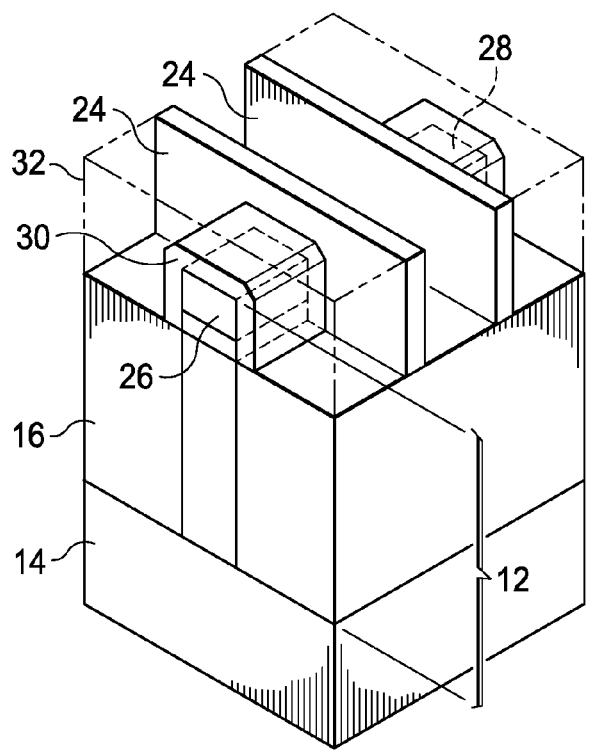
Figure 4J:
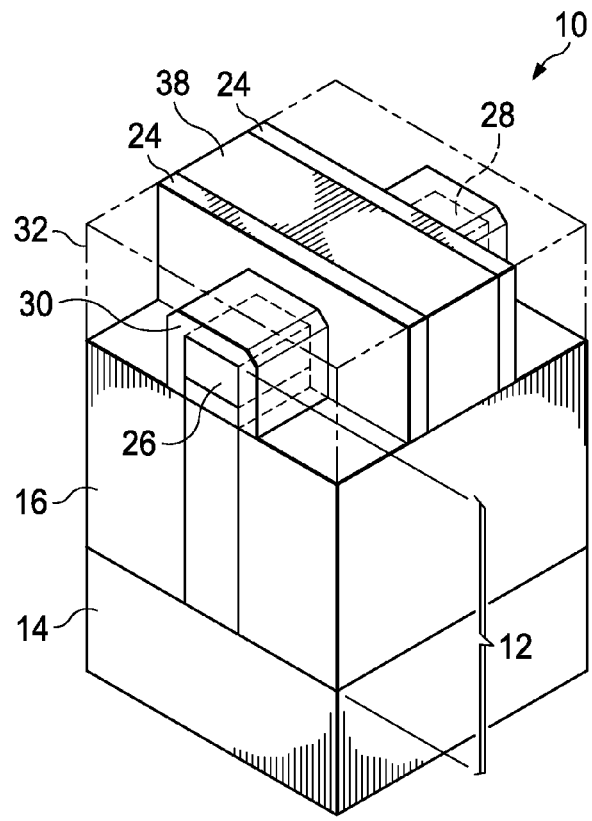

Referring now to FIG. 4h, the step of implantation of ions 34 is performed (if not already performed at the stage depicted in FIG. 4c, 4d, 4e, or 4f). Once the channel region 20 has been uniformly doped through the implantation of ions 34 through the sacrificial gate 18, the sacrificial gate 18 is removed as shown in FIG. 4i. In an embodiment, the sacrificial gate 18 is removed through an etching process. Thereafter, as shown in FIG. 4j, the sacrificial gate 18 is replaced by a metal gate stack 38 (a.k.a., a metal gate). In an embodiment, the metal gate stack 38 includes a high-k dielectric and a metal). In an embodiment, the metal gate stack 38 is subjected to a chemical-mechanical planarization (CMP) process.

Referring collectively to FIGS. 5a-5b, FIGS. 6a-6c, FIGS. 7a-7c, and FIGS. 8a-8b, a comparison of the variation in and impact upon threshold voltage ($V_{th}$) using a conventional implant scheme and the embodiment implantation process noted above is provided. Notably, the comparison includes different fin side wall (taper) angles (i.e., different fin 12 geometries). It should be recognized that there is significantly less variation of the threshold voltage with fin taper angle and with implant dose variation using the embodiment implantation process relative to the conventional implant process.

Figure 5B:
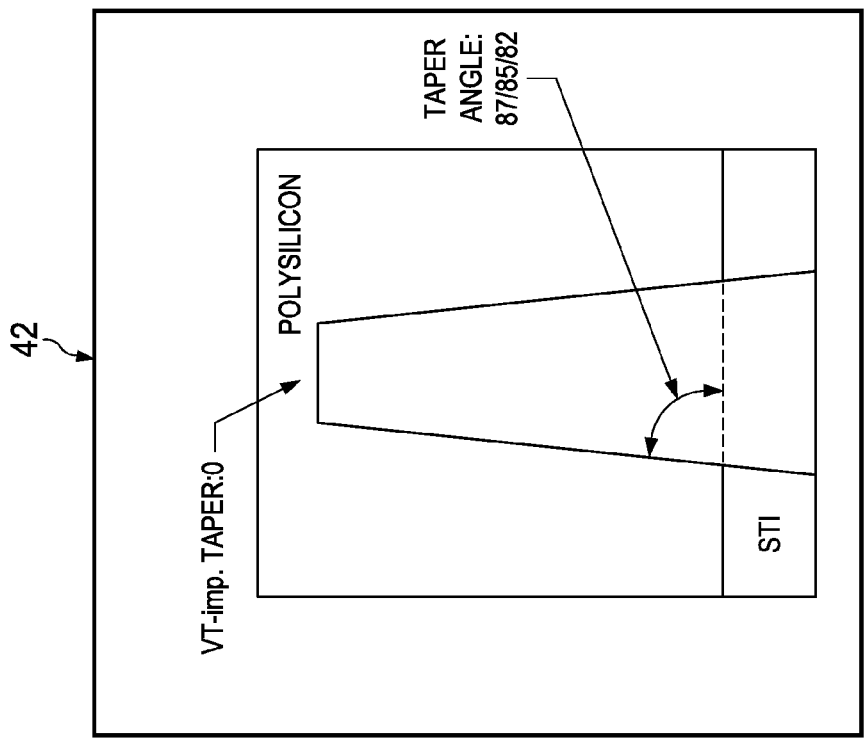
FIG. 5b illustrates an embodiment implantation process for various taper angles.
Figure 5A:
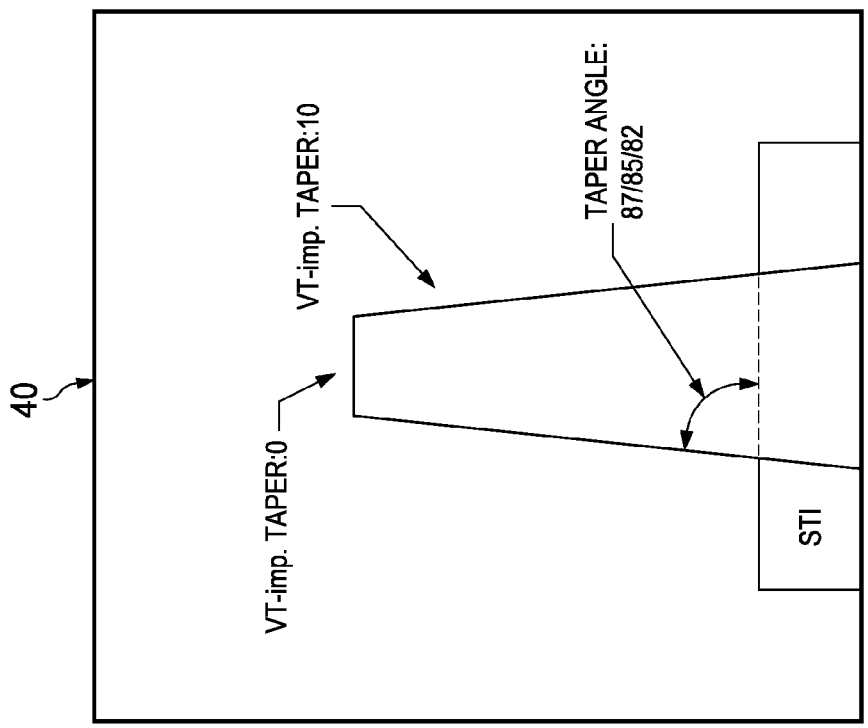
FIG. 5a illustrates a conventional implantation process for various taper angles.

Referring now to FIG. 5a, a conventional implantation process 40 is depicted for various taper angles (e.g., 87/85/82 degrees). In FIG. 5b, an embodiment implantation process 42 is depicted for the same taper angles. Referring now to FIG. 6a, a channel dose contour 46 is depicted for the conventional implantation process 40 of FIG. 5a at a taper angle of 87 degrees. In FIG. 6b, the channel dose contour 46 is depicted for the conventional implantation process 40 of FIG. 5a at a taper angle of 85 degrees. In FIG. 6c, the channel dose contour 46 is depicted for the conventional implantation process 40 of FIG. 5a at a taper angle of 82 degrees.

Referring now to FIG. 7a, a channel dose contour 48 is depicted for the embodiment implantation process 42 of FIG. 5b at a taper angle of 87 degrees. In FIG. 7b, the channel dose contour 48 is depicted for the embodiment implantation process 42 of FIG. 5b at a taper angle of 85 degrees. In FIG. 7c, the channel dose contour 48 is depicted for the embodiment implantation process 42 of FIG. 5b at a taper angle of 82 degrees. Notably, the channel dose contour 48 of FIGS. 7a-7c is more uniform relative to the channel dose contour 46 of FIGS. 6a-6c.

Figure 8A:
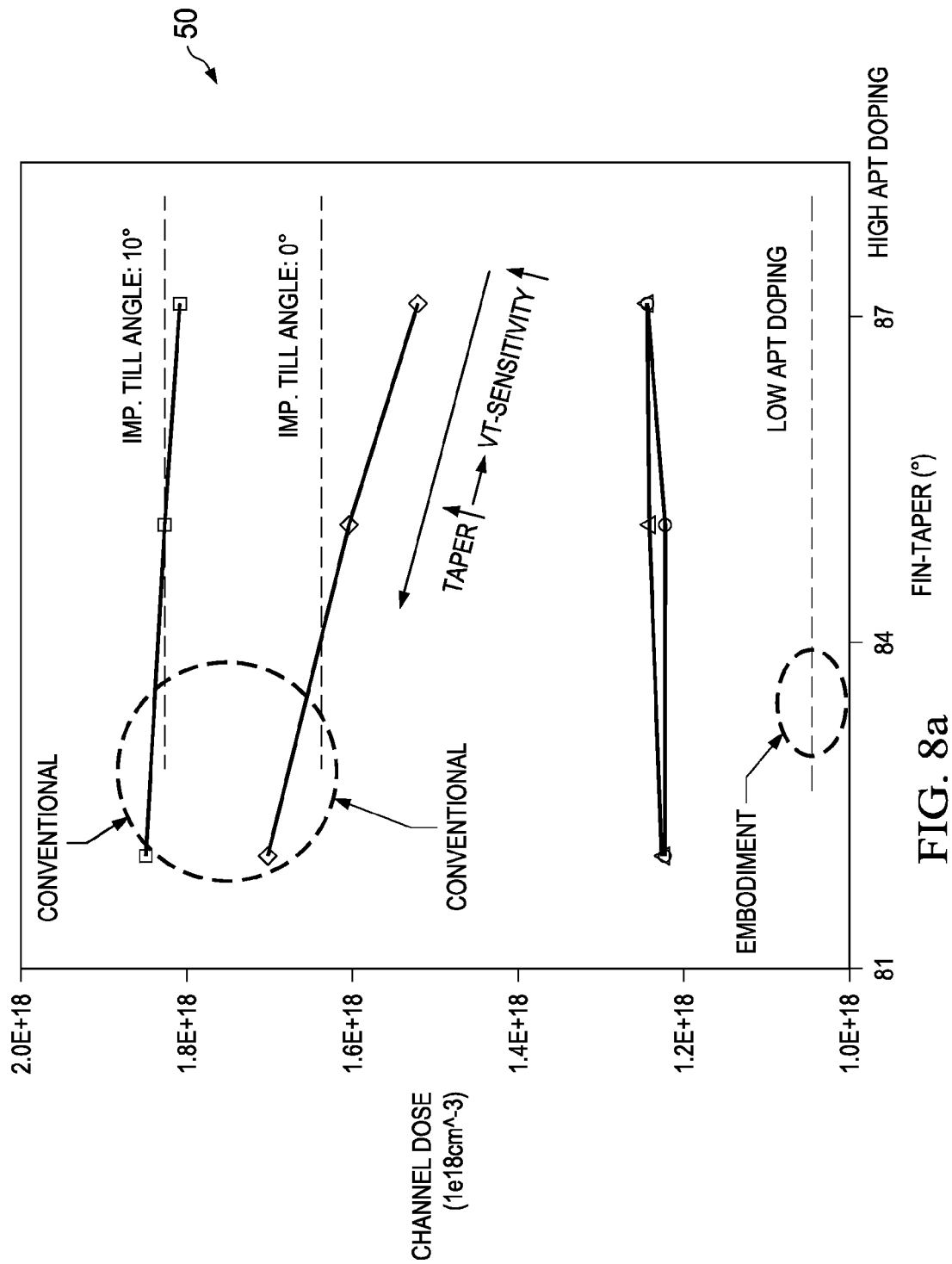
Figure 8B:
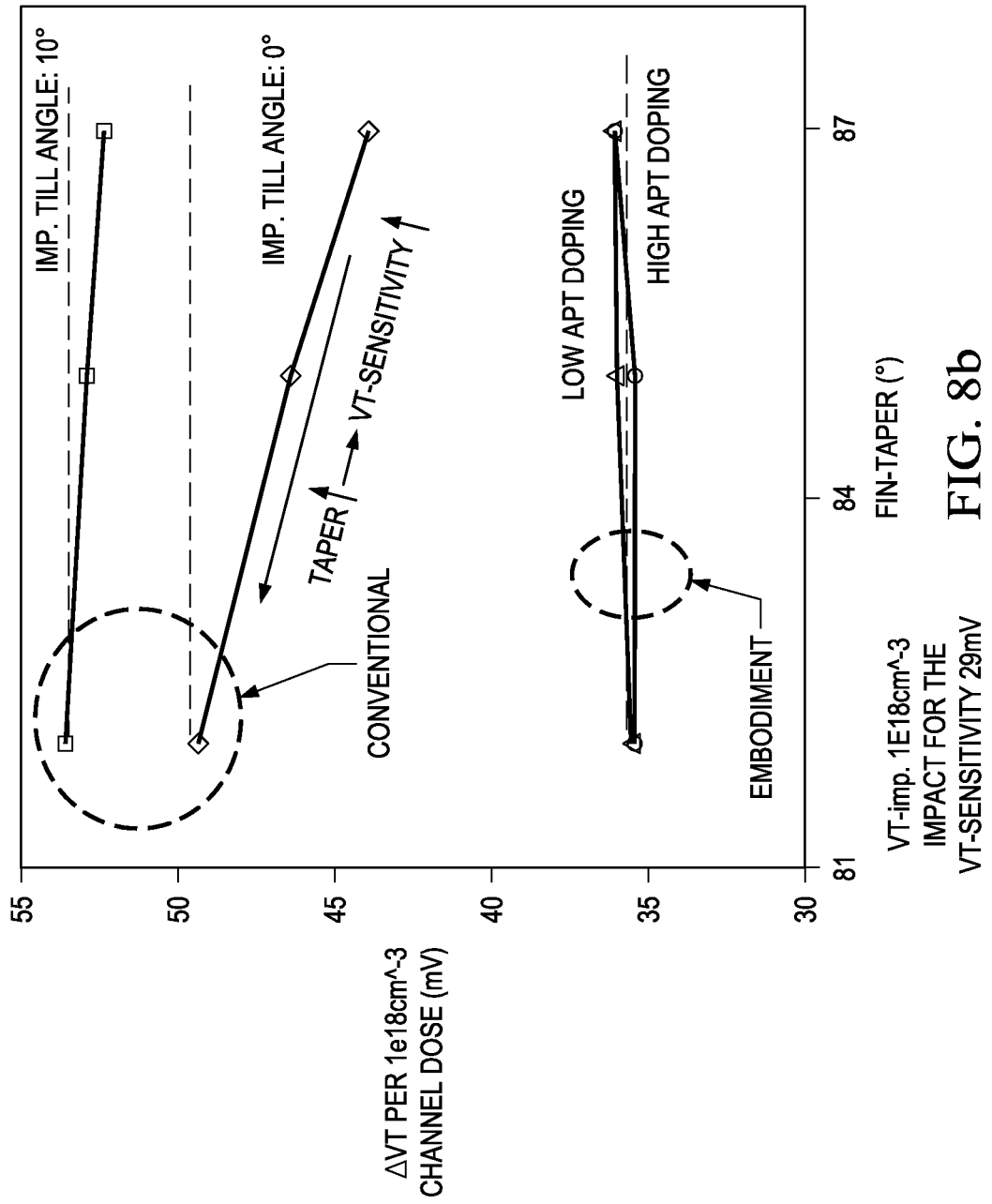
FIG. 8b is a graphical representation illustrating the threshold voltage for a multi-threshold voltage assessment using the embodiment implantation process of FIG. 5b.

Referring now to FIG. 8a, a chart 50 illustrates the threshold voltage for a multi-threshold voltage assessment using the conventional implantation process 40. In FIG. 8b, a chart 52 illustrates the threshold voltage for a multi-threshold voltage assessment using the embodiment implantation process 42. As shown by FIGS. 8a-8b, the threshold voltage is more uniform using the embodiment implantation process 42 of FIG. 5b.

From the foregoing, it should be appreciated that the embodiment implantation process disclosed herein reduces the variability of the doping profile in the channel region 20 of the FinFET 10. As such, the variability of parameters such as the threshold voltage is also reduced.

An embodiment fin field effect transistor (FinFET) includes fins formed from a semiconductor substrate, a field oxide disposed between the fins, and a sacrificial gate formed over a channel region of the fins projecting from the field oxide, the sacrificial gate providing the channel region of the fins with a uniform doping profile after an implantation of ions.

An embodiment method of forming a fin field effect transistor (FinFET) includes forming fins from a semiconductor substrate, forming a field oxide between the fins, forming a sacrificial gate over a channel region of the fins projecting from the field oxide, and implanting ions through the sacrificial gate to provide the channel region of the fins with a uniform doping profile.

An embodiment method of forming a fin field effect transistor (FinFET) includes forming fins from a semiconductor substrate, forming a field oxide between the fins, forming a sacrificial gate layer over a channel region of the fins projecting from the field oxide, the sacrificial gate layer chemically matched with the channel region of the fins, patterning the sacrificial gate layer to form a sacrificial gate, the sacrificial gate transversely oriented relative to the fins, forming an interlevel dielectric layer over a source and a drain on opposing sides of the sacrificial gate, and implanting ions through the sacrificial gate to provide the channel region of the fins with a uniform doping profile.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of forming a fin field effect transistor (FinFET), comprising:
    forming fins from a semiconductor substrate;
    forming a field oxide between the fins;
    forming a sacrificial gate over a channel region of the fins projecting from the field oxide; and
    implanting ions through the sacrificial gate to provide the channel region of the fins with a uniform doping profile.
2. The method of claim 1, further comprising chemically matching the channel region of the fins with the sacrificial gate.
3. The method of claim 2, further comprising patterning the sacrificial gate such that the sacrificial gate is transverse to the fins.
4. The method of claim 3, further comprising forming spacers and a source and a drain on opposing sides of the sacrificial gate, and forming an epitaxially grown semiconductor material over the source and the drain.
5. The method of claim 4, further comprising forming an interlevel dielectric layer over the sacrificial gate and recessing the interlevel dielectric layer prior to the step of implanting ions.
6. The method of claim 5, further comprising replacing the sacrificial gate with a gate stack.
7. A method of forming a fin field effect transistor (FinFET), comprising:
    forming fins from a semiconductor substrate;
    forming a field oxide between the fins;
    forming a sacrificial gate layer over a channel region of the fins projecting from the field oxide, the sacrificial gate layer chemically matched with the channel region of the fins;
    patterning the sacrificial gate layer to form a sacrificial gate, the sacrificial gate transversely oriented relative to the fins;
    forming an interlevel dielectric layer over a source and a drain on opposing sides of the sacrificial gate; and
    implanting ions through the sacrificial gate to the channel region.
8. The method of claim 7, further comprising flattening a top surface of the sacrificial gate layer using a chemical-mechanical planarization process.
9. The method of claim 8, further comprising removing the sacrificial gate using an etching process and replacing the sacrificial gate with a gate stack.
10. A method of forming a fin field effect transistor (FinFET), comprising:
    forming a sacrificial gate layer over a channel region of fins projecting from a shallow trench isolation region;
    patterning the sacrificial gate layer to form a sacrificial gate, the sacrificial gate in a polycrystalline form and transversely oriented relative to the fins;
    forming an interlevel dielectric layer over a source and a drain on opposing sides of the sacrificial gate; and
    implanting ions through the sacrificial gate and into the channel region of the fins.
11. The method of claim 10, further comprising forming the fins by etching a semiconductor substrate.
12. The method of claim 10, further comprising chemically matching the channel region of the fins with the sacrificial gate.
13. The method of claim 10, further comprising subjecting the sacrificial gate layer to a chemical-mechanical planarization (CMP) process to planarize a top surface of the sacrificial gate layer.
14. The method of claim 10, further comprising forming spacers on opposing sides of the sacrificial gate.
15. The method of claim 10, further comprising forming a source and a drain on opposing sides of the sacrificial gate.
16. The method of claim 15, further comprising forming an epitaxially grown semiconductor material over the source and the drain.
17. The method of claim 10, further comprising forming the interlevel dielectric from silicon dioxide.
18. The method of claim 17, further comprising subjecting the sacrificial gate layer to a chemical-mechanical planarization (CMP) process.
19. The method of claim 17, further comprising recessing the interlevel dielectric layer prior to the step of implanting ions.

20. The method of claim 10, further comprising replacing the sacrificial gate with a gate stack.

\* \* \* \* \*